United States Patent
Kim

(10) Patent No.: US 7,925,368 B2
(45) Date of Patent: Apr. 12, 2011

(54) AUTOMATIC TRANSFER APPARATUS FOR LIQUID CRYSTAL DISPLAY DEVICE AND METHOD FOR SENSING OBSTACLE USING THE SAME

(75) Inventor: Hyeon-Seok Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1318 days.

(21) Appl. No.: 11/477,785

(22) Filed: Jun. 30, 2006

(65) Prior Publication Data

US 2007/0168071 A1 Jul. 19, 2007

(30) Foreign Application Priority Data

Dec. 30, 2005 (KR) .................. 10-2005-0136194

(51) Int. Cl.
*G06F 19/00* (2006.01)
(52) U.S. Cl. ........................................... 700/112
(58) Field of Classification Search .................. 700/112
See application file for complete search history.

(56) References Cited

U.S. PATENT DOCUMENTS

2001/0002533 A1   6/2001   Rhody et al.

FOREIGN PATENT DOCUMENTS

| JP | 2-8777 A | 1/1990 |
|---|---|---|
| JP | 2003-176021 A | 6/2003 |

*Primary Examiner* — Michael Holmes
(74) *Attorney, Agent, or Firm* — Morgan, Lewis & Bockius LLP

(57) ABSTRACT

An automatic transfer apparatus for a liquid crystal display device comprising a mounting unit for placing a cassette in which a plurality of substrates are received, a moving unit disposed at a lower surface of the mounting unit and moving within a designated interval or section, and a sensing member mounted in the moving unit for sensing an obstacle, wherein the sensing member for sensing an obstacle at a bottom is disposed at the lower surface of the automatic transfer apparatus so as to enable a previous checking an existence of the obstacle, thereby preventing a structure of the automatic transfer apparatus from being damaged due to the obstacle.

18 Claims, 6 Drawing Sheets

AUTOMATIC TRANSFER APPARATUS FOR LIQUID CRYSTAL DISPLAY DEVICE AND METHOD FOR SENSING OBSTACLE USING THE SAME

BACKGROUND OF THE INVENTION

1. Field of the Invention

The present invention relates to an automatic transfer apparatus for a liquid crystal display (LCD) device and a method for sensing obstacle using the same, and particularly, to an automatic transfer apparatus for an LCD device which is capable of preventing a damage on a structure of an automatic transfer apparatus due to an obstacle by mounting a sensing member which is mounted at a bottom surface of the automatic transfer apparatus to sense the obstacle on the bottom, and by previously checking an existence of the obstacle.

2. Background of the Invention

Development of information society has gradually enhanced requirements for various types of display devices. Among various types of flat panel display devices such as liquid crystal displays (LCDs), plasma display panels (PDPs), electro luminescent displays (ELDs), field emission displays (FEDs), and the like LCDs are spotlighted the most to continue be developed as monitors for TV sets and desktop computers as well as monitors for notebook computers.

The LCD device may broadly be divided into LCD panels for displaying images and a driving unit for applying a driving signal to the LCD panels.

As shown in FIG. 1, a related art LCD panel includes first and second substrates 1 and 2 which are bonded to each other with a certain space therebetween, and a liquid crystal layer 3 injected between the first and second substrates 1 and 2.

Here, the first substrate 1 (i.e., a thin film transistor (TFT) array substrate) includes a plurality of gate lines 4 arranged in one direction by a certain interval therebetween, a plurality of data lines 5 arranged by a certain interval therebetween in a direction perpendicular to each gate line 4, a plurality of pixel electrodes P formed in a matrix shape at each pixel region defined at an intersection between the gate lines 4 and the data lines 5, and a plurality of TFTs which are switched by a signal from the gate line 4 to transfer a signal from the data line 5 to each pixel electrode P.

Furthermore, the second substrate 2 (i.e., a color filter substrate) includes a black matrix layer 7 for preventing light from being transmitted to regions rather than the pixel regions, R, G and B color filter layers 8 for rendering color and a common electrode 9 for implementing images. Here, the common electrode 9 may be formed on the first substrate 1 in an LCD device employing a horizontal electric field mode.

The LCD device having such structure is fabricated by processes for fabricating a TFT array on the first substrate 1, fabricating a color filter layer on the second substrate 2, bonding the first and second substrates 1 and 2 to each other, injecting a liquid crystal between the bonded substrates 1 and 2 and sealing the liquid crystal, testing and repairing each LCD panel in which the liquid crystal has been injected, and mounting a back light or the like in each LCD panel with a good quality and mounting a driving circuit to fabricate a liquid crystal display module.

The substrates undergoes such various processes to completely be the LCD device. The substrates are transferred to devices which perform each process by use of an automatic transfer apparatus.

With reference to FIGS. 2 and 3, explanation will now be given for a related art automatic transfer apparatus used to transfer the substrates to the devices for performing each process upon fabricating an LCD device.

FIG. 2 is a schematic view showing a related art automatic transfer apparatus having a cassette.

FIG. 3 is a schematic view showing the related art automatic transfer apparatus having the cassette, which shows a case that there is an obstacle on a movement direction.

Referring to FIG. 2, a related art automatic transfer apparatus 10 includes a mounting unit 15 for placing a cassette 31 in which a plurality of substrates are received in order to perform each process, and a moving unit 11 disposed at a bottom of the mounting unit 15 and moving within a designated interval, namely, moving toward each processing device by use of rotational movement members 13. A distance T1 is a height between the outer bottom surface 41 and the lower portion of the moving unit 11. The mounting unit 15 of the automatic transfer apparatus 10 has a robot arm 21 which is used to load the cassette 31 which is positioned at an input port (not shown) and an output port (not shown) of a stoker (not shown) directly on the mounting unit 15 or to unload the cassette 31 which has been loaded on the mounting unit 15 to the stoker.

In a state that the automatic transfer apparatus 10 is moved toward each processing device in order to perform each process, the cassette 31 which has been loaded on the mounting unit 15 by the robot arm 21 or the cassette which is placed at the input port or output port is moved to each processing device or to the stoker.

However, as shown in FIG. 3, it is impossible for the automatic transfer apparatus 10 according to the related art to sense an obstacle 51 on the bottom out of the range in which a front of the obstacle 51 can be sensed. Here, T2 is a thickness of the obstacle 51.

Therefore, impurities come into the bottom of the automatic transfer apparatus 10, which causes interference with a lower structure of the automatic transfer apparatus 10, resulting in problems in devices. That is, when an obstacle which is not sensed at a bottom of a movement detecting sensor or the moving unit is sucked into the bottom of the automatic transfer apparatus, damages may occur on the bottom structure of the automatic transfer apparatus.

SUMMARY OF THE INVENTION

Therefore, an object of the present invention is to provide an automatic transfer apparatus for a liquid crystal display (LCD) device and a method for sensing obstacle using the same capable of preventing a damage on a structure of an automatic transfer apparatus by mounting a device for sensing an obstacle on a bottom of the automatic transfer apparatus.

To achieve these and other advantages and in accordance with the purpose of the present invention, as embodied and broadly described herein, there is provided an automatic transfer apparatus for a liquid crystal display device comprising: a mounting unit; a moving unit disposed at the mounting unit; a sensing member disposed at the moving unit for sensing an obstacle; and an alarm signal unit for generating alarm signal.

To achieve these and other advantages and in accordance with the purpose of the present invention, as embodied and broadly described herein, there is provide d a method for sensing obstacle using an automatic transfer apparatus for a liquid crystal display device comprising: providing a mounting unit; providing a moving unit disposed at the mounting unit; disposing a sensing member at the moving unit for sensing an obstacle; and disposing an alarm signal unit to generate alarm signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

Hereinafter, an automatic transfer apparatus for an LCD device according to the present invention will be explained in detail with reference to the attached drawings.

Figure 1:
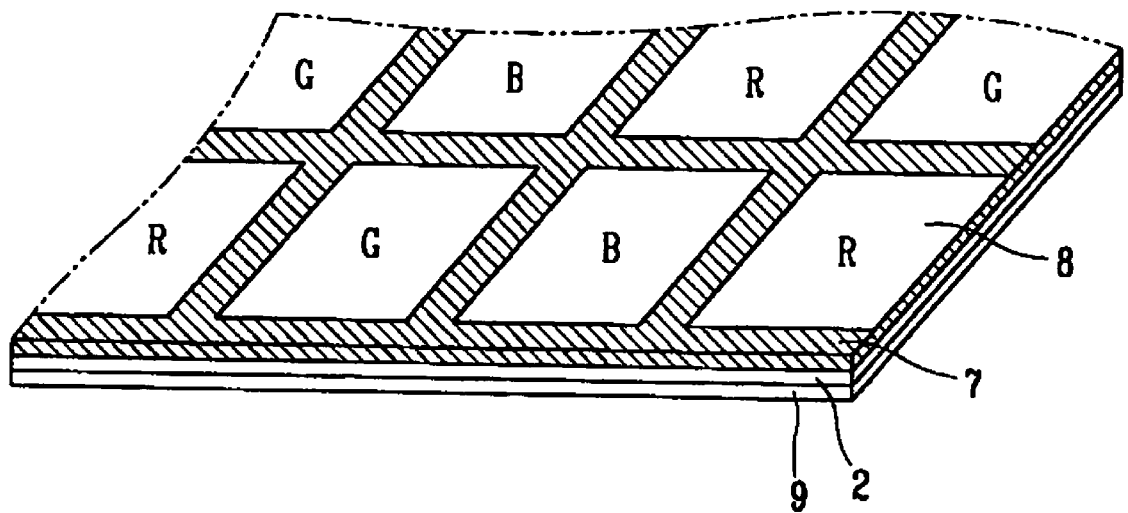
FIG. 1 is an exploded perspective view showing a part of a related art LCD panel.
Figure 1:
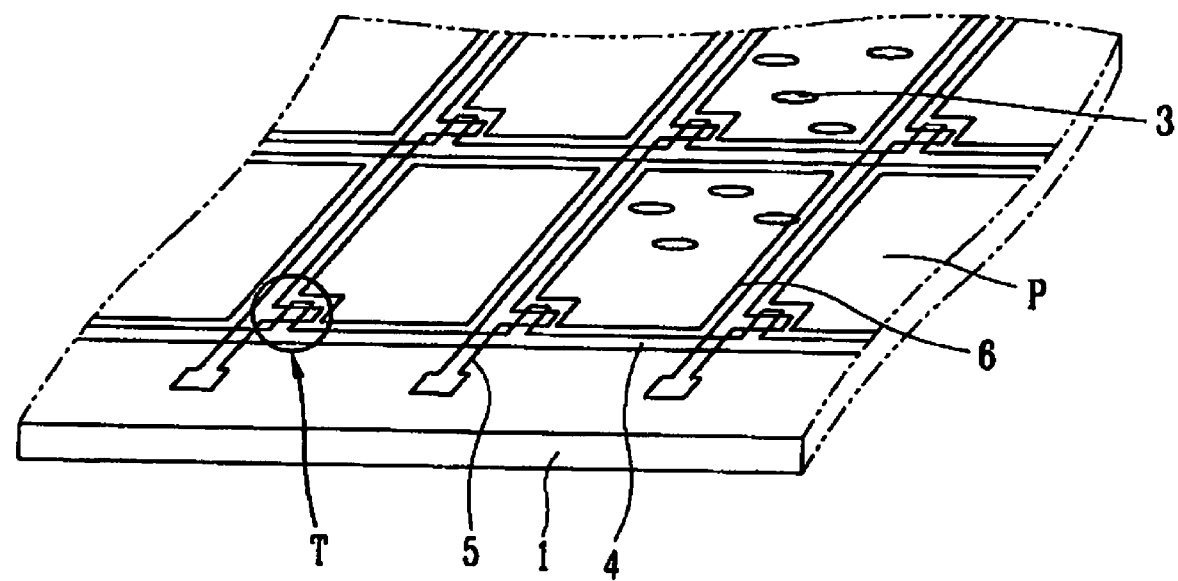
Figure 2:
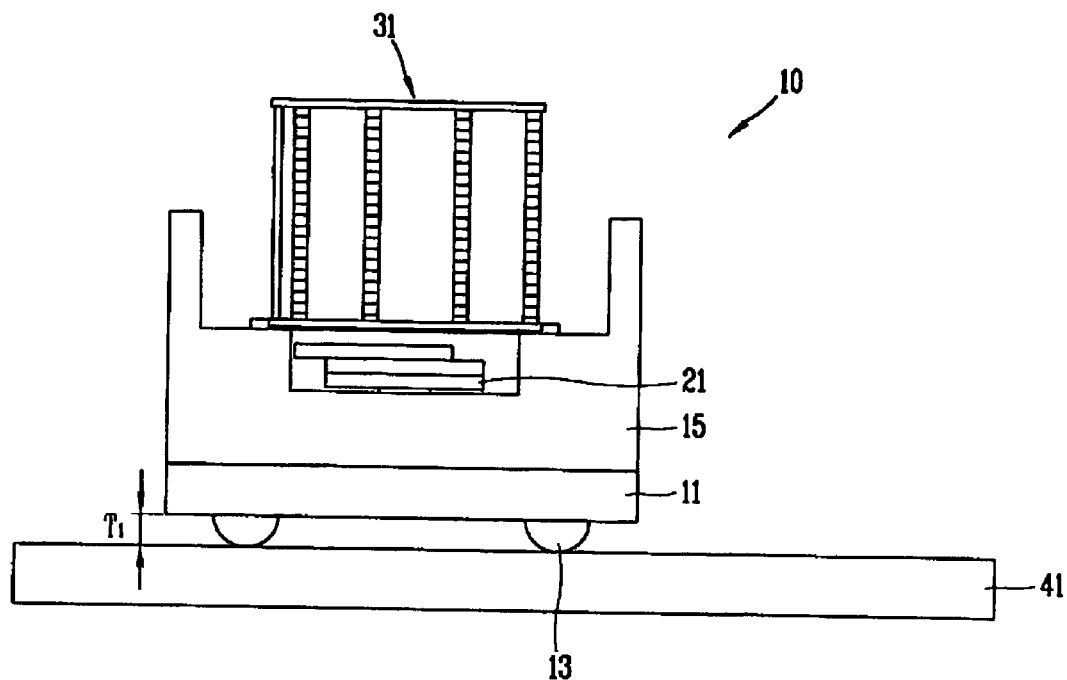
FIG. 2 is a schematic view showing a related art automatic transfer apparatus in which a cassette is mounted.
Figure 3:
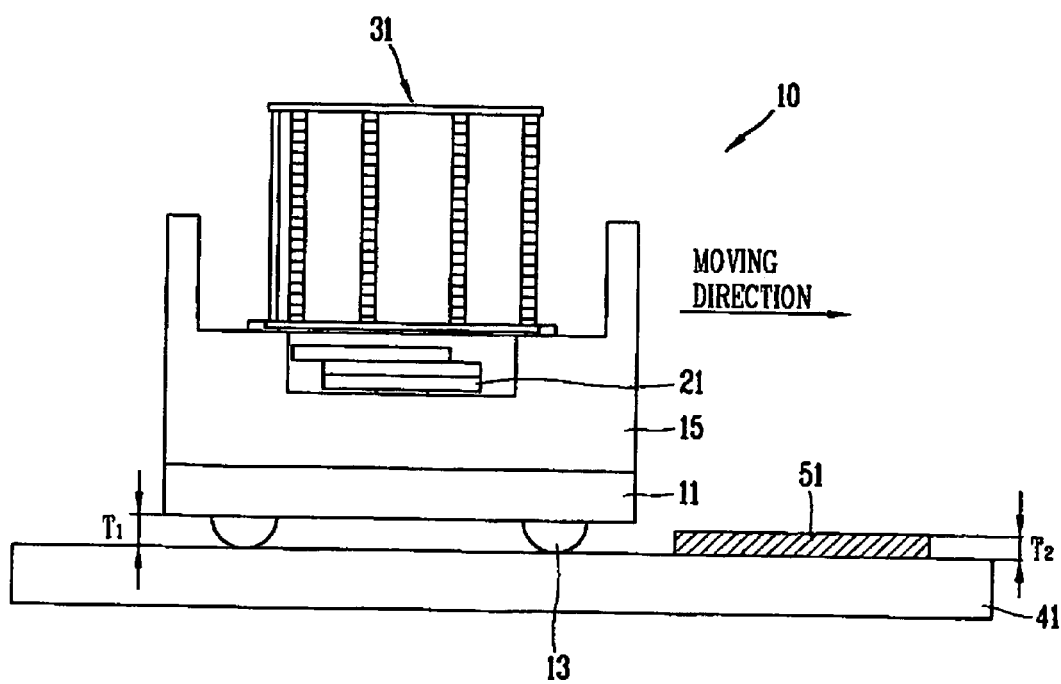
FIG. 3 is a schematic view showing the related art automatic transfer apparatus in which the cassette is mounted, which shows a case that there exists an obstacle on a movement direction.
Figure 4:
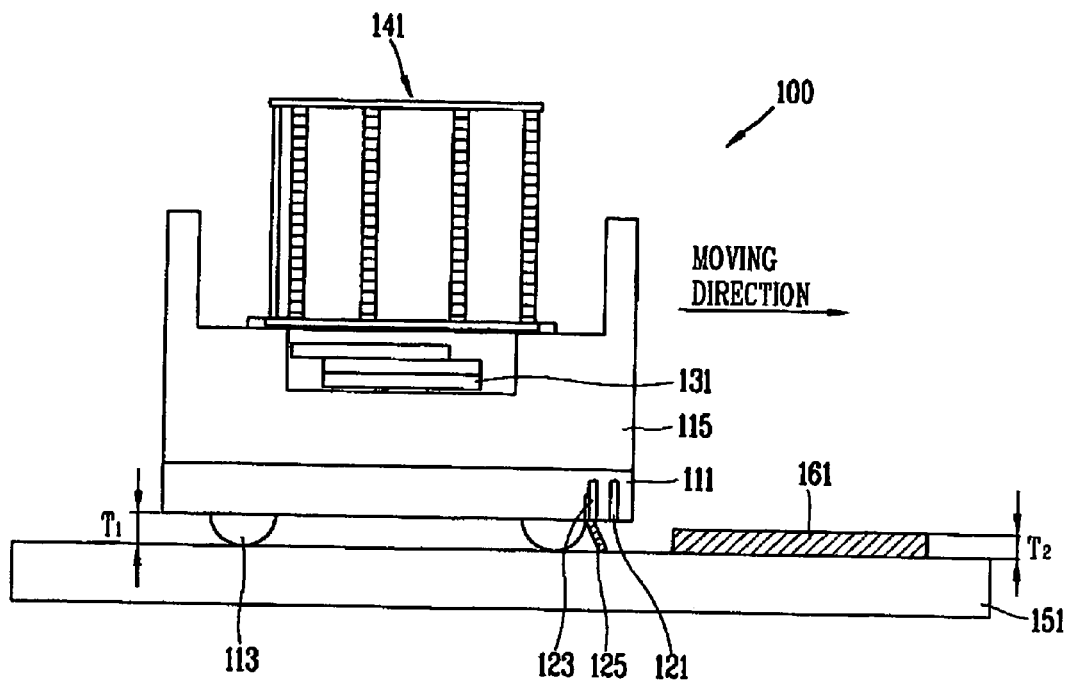
FIG. 4 is a schematic view showing an automatic transfer apparatus for an LCD device according to an one embodiment of the present invention.
Figure 5:
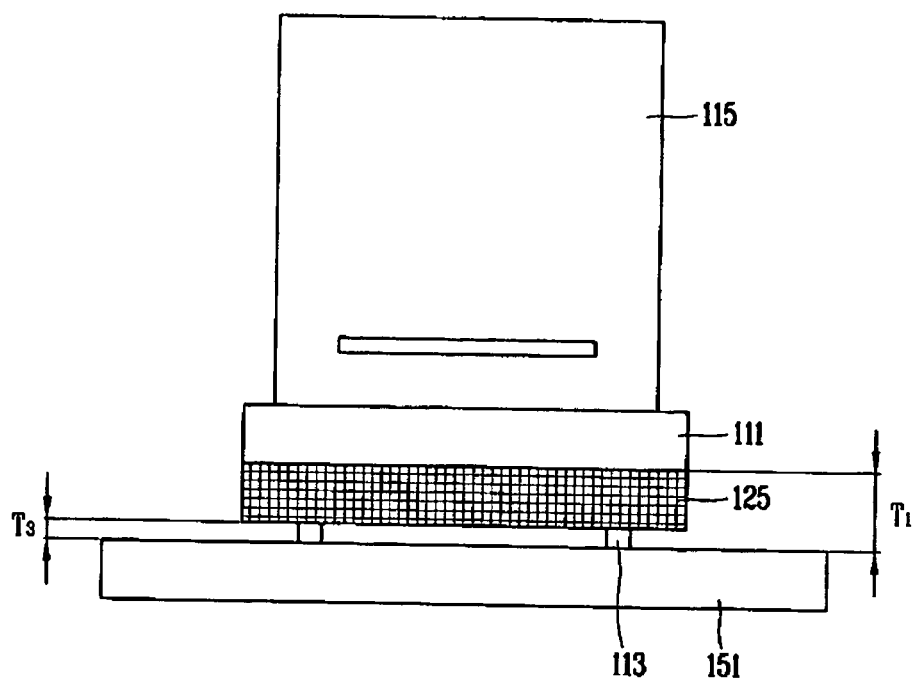
FIG. 5 is a lateral view showing the automatic transfer apparatus according to the one embodiment of the present invention, which shows an obstacle sensing member.

FIG. 4 is a schematic view showing an automatic transfer apparatus for an LCD device according to an one embodiment of the present invention, and FIG. 5 is a lateral view of the automatic transfer apparatus according to the one embodiment of the present invention, which shows an obstacle sensing member.

Figure 6:
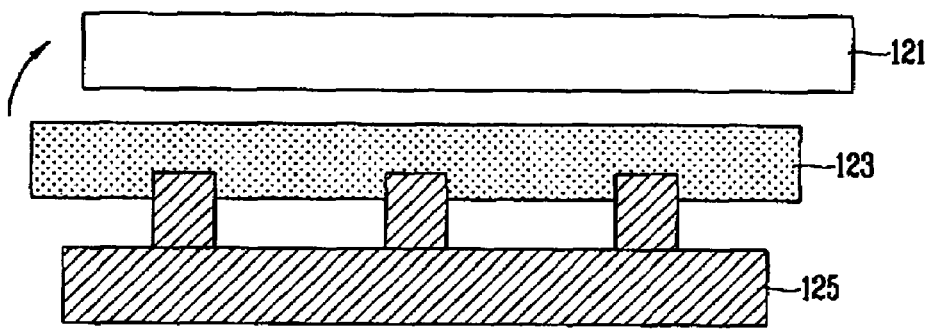
FIG. 6 is a schematic view showing an obstacle sensing member mounted at a bottom portion of the automatic transfer apparatus according to the one embodiment of the present invention.

FIG. 6 is a schematic view showing an obstacle sensing member at a bottom of the automatic transfer apparatus according to the one embodiment of the present invention.

Figure 7:
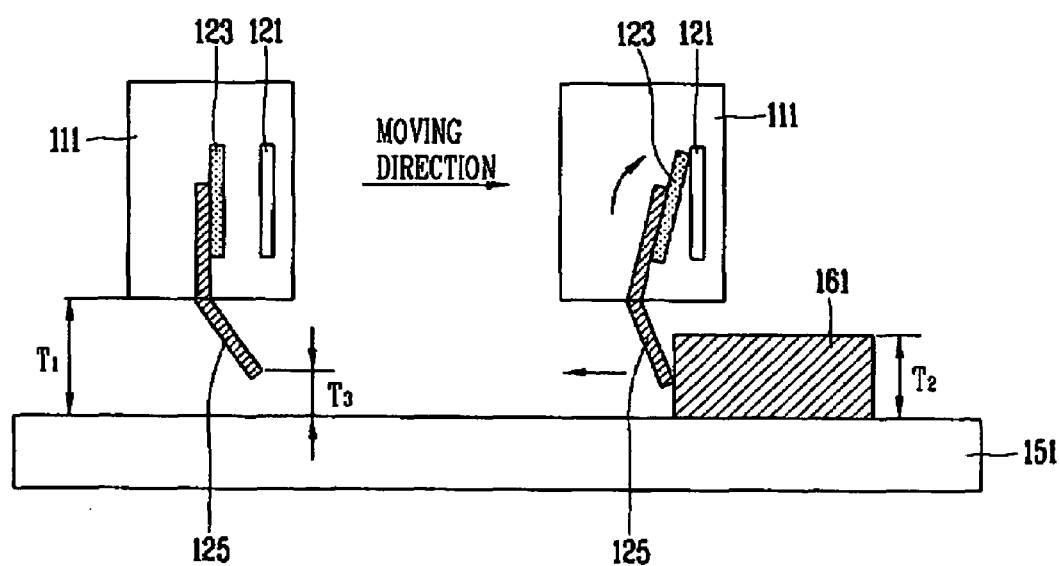
FIG. 7 is a schematic view showing an operational state of the obstacle sensing member mounted at the bottom portion of the automatic transfer apparatus according to the one embodiment of the present invention.

FIG. 7 is a schematic view showing an operational state of the obstacle sensing member mounted at the bottom of the automatic transfer apparatus according to the one embodiment of the present invention.

As shown in FIGS. 4 and 5, an automatic transfer apparatus 100 according to the present invention includes a mounting unit 115 for placing a cassette 141 in which a plurality of substrates are received in order to perform each process, and a moving unit 111 disposed at a lower portion of the mounting unit 115 and moving within a designated interval (section), namely, toward each processing device, by rotational movement members 113.

Furthermore, the mounting unit 115 of the automatic transfer apparatus 100 is provided with a robot arm 131, which is used to load the cassette 141 placed at an input port (not shown) or an output port (not shown) of a stoker (not shown) to the mounting unit 115 or to unload the cassette 141 loaded on the mounting unit 115 to the stoker (not shown).

In a state that the automatic transfer apparatus 100 is moved toward each processing device by virtue of the movement of the automatic transfer apparatus 100 in order to perform each process, the cassette 141 which has been loaded on the mounting unit 115 by the robot arm 131 or the cassette which is placed at the input port or output port is moved to each processing device or the stoker.

A sensing member is provided within the moving unit 111 of the automatic transfer apparatus 100. The sensing member includes two tape sensors 121 and 123 and an obstacle sensing bar 125. The one tape sensor 123 of the two tape sensors 121 and 123 is coupled to the obstacle sensing bar 125. One end of the obstacle sensing bar 125 is protruded downwardly to outer bottom surface 151 by a predetermined distance T3. The distance T3 is a height between the outer bottom surface 151 and the end portion of the obstacle sensing bar 125. Further, the automatic transfer apparatus 100 includes an alarm signal unit (not shown) for generating alarm signal when the obstacle is sensed by the sensing member.

As shown in FIGS. 5, 6 and 7, the obstacle sensing bar 125 is protruded enough to sense an obstacle 161 having a thickness T2 smaller than a height T1 between the moving unit 111 of the automatic transfer apparatus 100 and the outer bottom surface 151. The obstacle sensing bar 125 is protruded downwardly to outer bottom surface 151. And the obstacle sensing bar 125 maybe incline in a forward or backward direction. The obstacle sensing bar 125 is configured to be pushed back when it is contacted with the obstacle 161. When the obstacle sensing bar 125 is moved by being pushed back by the obstacle 161, the tape sensor 123 coupled to the obstacle sensing bar 125 is simultaneously moved in a direction opposite to that of the obstacle sensing bar 125, to be in contact with the other tape sensor 121 corresponding thereto.

Hence, as shown in FIG. 7, when the automatic transfer apparatus 100 is moved forwardly, if the obstacle 161 placed at the front area of the automatic transfer apparatus 100 is in contact with the obstacle sensing bar 125, the obstacle sensing bar 125 is pushed back by the obstacle 161. Then the tape sensor 123 coupled to the obstacle sensing bar 125 is moved in the opposite direction to that of the obstacle sensing bar 125 to be in contact with the other tape sensor 121. The tape sensors 121 and 123 which have been contacted to each other start to be operated, thereby giving the automatic transfer apparatus 100 to a pause and operating an alarm by the alarm signal unit (not shown).

Afterwards, an operator removes the obstacle 161 sensed at the bottom of the automatic transfer apparatus 100 to continue to perform the operation.

Meanwhile, another embodiments of the present invention is described as follows.

Figure 8:
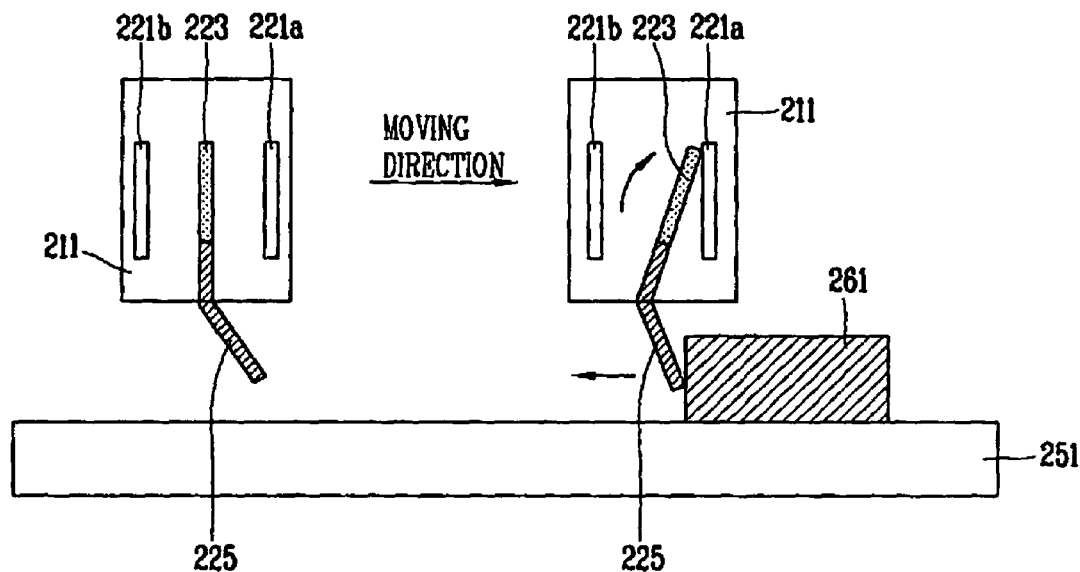
FIG. 8 is a schematic view showing an operational state of the obstacle sensing member mounted at the bottom portion of the automatic transfer apparatus according to an another embodiment of the present invention.

FIG. 8 is a schematic view showing an operational state of the obstacle sensing member mounted at the bottom portion of the automatic transfer apparatus according to an another embodiment of the present invention.

Figure 9:
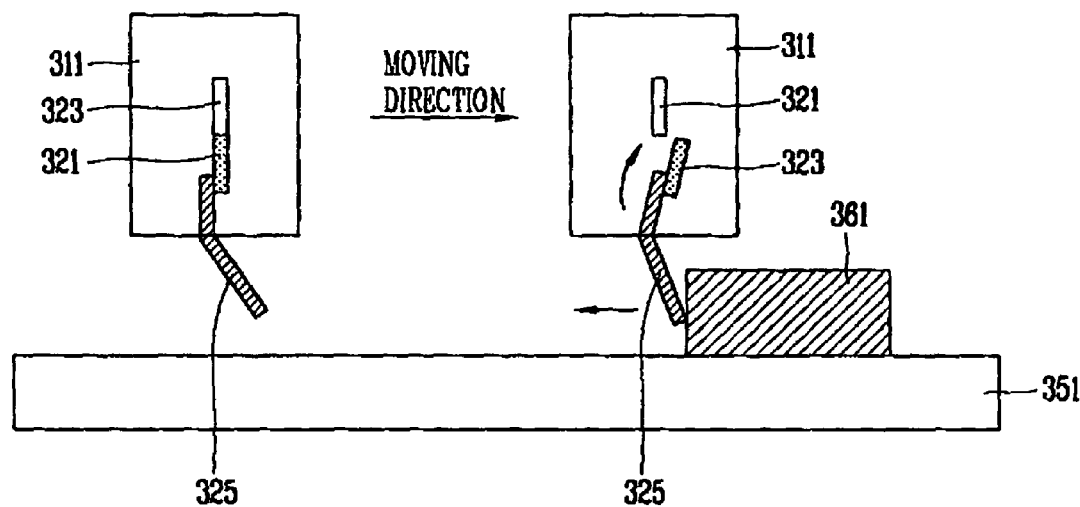
FIG. 9 is a schematic view showing an operational state of the obstacle sensing member mounted at the bottom portion of the automatic transfer apparatus according to further another embodiment of the present invention.

FIG. 9 is a schematic view showing an operational state of the obstacle sensing member mounted at the bottom portion of the automatic transfer apparatus according to further another embodiment of the present invention.

Figure 10:
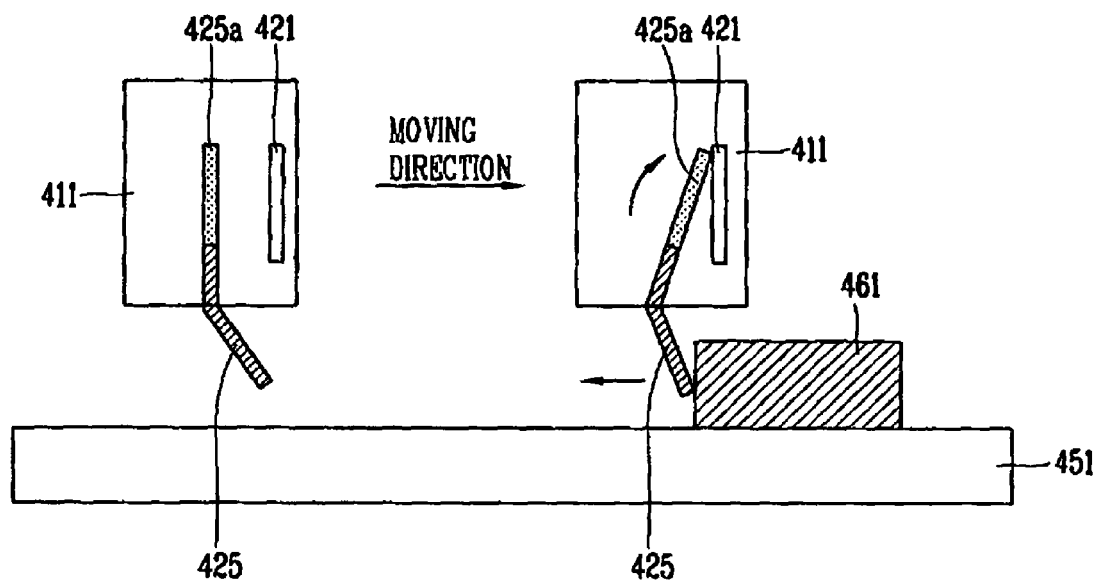
FIG. 10 is a schematic view showing an operational state of the obstacle sensing member mounted at the bottom portion of the automatic transfer apparatus according to further another embodiment of the present invention.

FIG. 10 is a schematic view showing an operational state of the obstacle sensing member mounted at the bottom portion of the automatic transfer apparatus according to further another embodiment of the present invention.

Figure 11:
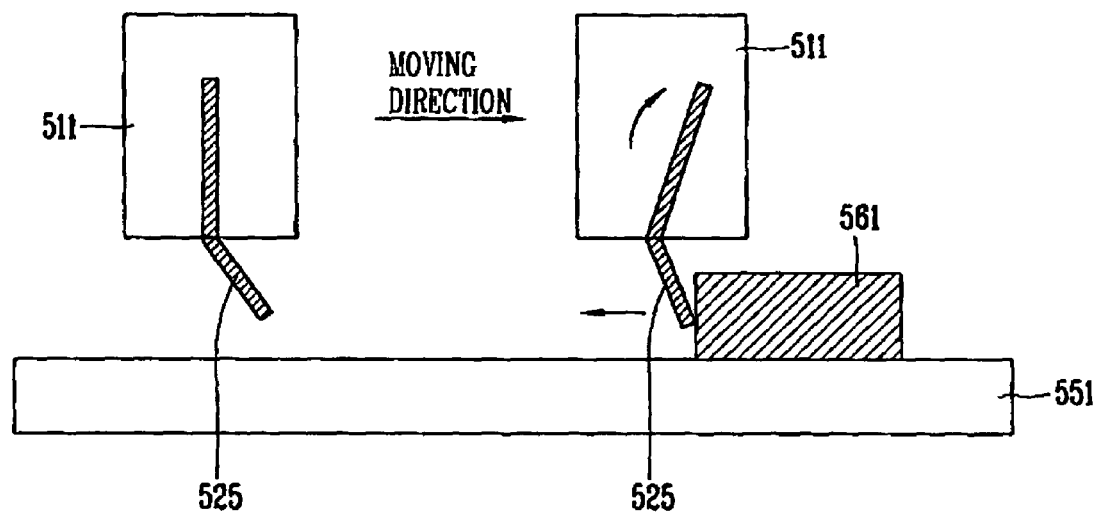
FIG. 11 is a schematic view showing an operational state of the obstacle sensing member mounted at the bottom portion of the automatic transfer apparatus according to further another embodiment of the present invention.

FIG. 11 is a schematic view showing an operational state of the obstacle sensing member mounted at the bottom portion of the automatic transfer apparatus according to further another embodiment of the present invention.

As shown in FIG. 8, a sensing member according to an another embodiment of the present invention includes two tape sensors 221a and 221b spaced apart from each other and an obstacle sensing bar 225 coupled to a tape sensor portion 223. Accordingly, the tape sensor portion 223 coupled to one of two tape sensors 221a and 221b.

Accordingly, one of the tape sensors 221a and 221b and the sensor portion 223 which have been contacted to each other start to be operated, thereby giving the automatic transfer apparatus to a pause and operating an alarm by the alarm signal unit (not shown).

Afterwards, an operator removes the obstacle 261 sensed at the bottom of the automatic transfer apparatus to continue to perform the operation.

As shown in FIG. 9, a sensing member according to further another embodiment of the present invention includes tape sensors 321 and 323 is in contact with each other and an obstacle sensing bar 325 coupled to a tape sensor 323. Accordingly, when the obstacle sensing bar 325 is pushed back by the obstacle 361, the tape sensor 323 is not contacted with the tape sensor 321.

Accordingly, the tape sensors 321 and 323 have been not contacted to each other start to be operated, thereby giving the automatic transfer apparatus to a pause and operating an alarm by the alarm signal unit (not shown).

Afterwards, an operator removes the obstacle 361 sensed at the bottom of the automatic transfer apparatus to continue to perform the operation.

As shown in FIG. 10, a sensing member according to further another embodiment of the present invention includes a tape sensor 421, and a obstacle sensing bar 425 spaced apart from the tape sensor 421. Further, the obstacle sensing bar 425 includes another tape sensor portion 425a which is in contact with the tape sensor 421. The obstacle sensing bar 425 and the another tape sensor 425a comprise a single body.

Accordingly, the tape sensors 421 and 425a have been contacted to each other start to be operated, thereby giving the automatic transfer apparatus to a pause and operating an alarm by the alarm signal unit (not shown).

Afterwards, an operator removes the obstacle 461 sensed at the bottom of the automatic transfer apparatus to continue to perform the operation.

As shown in FIG. 11, a sensing member according to further another embodiment of the present invention includes a obstacle sensing bar 525. The obstacle sensing bar 525 has a sensor function for sensing the obstacle.

Accordingly, when the obstacle sensing bar 525 senses the obstacle 561, thereby giving the automatic transfer apparatus to a pause and operating an alarm by the alarm signal unit (not shown).

Afterwards, an operator removes the obstacle 561 sensed at the bottom of the automatic transfer apparatus to continue to perform the operation.

As aforementioned, several effect can be expected by use of the automatic transfer apparatus for the LCD device according to the present invention.

Regarding the automatic transfer apparatus for the LCD device according to the present invention, the sensing bar capable of sensing the obstacle is mounted at the automatic transfer apparatus. Accordingly, the sensing bar can be used to easily sense and remove the obstacle while moving the automatic transfer apparatus, whereby such small obstacles which have not been detected can be sensed to accordingly be possible to protect the lower structure of the automatic transfer apparatus from being damaged due to the small obstacles.

Hence, upon using the automatic transfer apparatus according to the present invention, the obstacles can previously be detected to make the automatic transfer apparatus pause, thereby ensuring high stability of the automatic transfer apparatus.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An automatic transfer apparatus comprising:
   a mounting unit for holding a cassette in which a plurality of substrates are received;
   a moving unit below the mounting unit for moving the mounting unit; and
   a sensing member mounted in the moving unit for sensing an obstacle in a path of the transfer apparatus,
   wherein the sensing member includes
   two tape sensors spaced apart from each other by an interval; and
   a sensing bar with one end coupled to one of the two tape sensors and the other end of the sensing bar protruding downwardly from a lower portion of the moving unit.

2. The apparatus of claim 1, wherein the two tape sensors sound an alarm when in contact with each other.

3. The apparatus of claim 1, wherein the sensing bar has a ground clearance height such that obstacles having a height less than the ground clearance height will not affect movement of the moving unit or damage the substrates in the cassette.

4. The apparatus of claim 2, wherein the sensing bar is positioned in front of a rotational movement member in the progress direction of the moving unit.

5. The apparatus of claim 4, further comprising another sensing bar on an opposite side of moving unit for when the moving unit operates in reverse.

6. The apparatus of claim 1, wherein the mounting unit is provided with a robot arm.

7. The apparatus of claim 1, wherein the obstacle sensing member is a bar inclined down toward the progress direction of the moving unit.

8. The apparatus of claim 7, wherein the sensing bar has a same width as the moving unit.

9. The apparatus of claim 1, wherein an alarm sounds when an obstacle is sensed.

10. The apparatus of claim 1, wherein the moving unit ceases movement when an obstacle is sensed.

11. An automatic transfer apparatus comprising:

a mounting unit for holding a cassette in which a plurality of substrates are received;

a moving unit below the mounting unit for moving the mounting unit;

rotational movement members provided at a lower surface of the moving unit:

a sensing bar mounted in front of the rotational movement members in the progress direction of the moving unit for sensing an obstacle in a path of the transfer apparatus; and two tape sensors spaced apart from each other by an interval with the sensing bar coupled to one of the two tape sensors.

12. The apparatus of claim 11, wherein the sensing bar has a ground clearance height such that obstacles having a height less than the ground clearance height will not affect movement of the moving unit or damage substrates in the cassette.

13. The apparatus of claim 11, further comprising another sensing bar on an opposite side of moving unit for when the moving unit operates in reverse.

14. The apparatus of claim 11, wherein the mounting unit is provided with a robot arm.

15. The apparatus of claim 11, wherein the sensing bar is inclined down toward the progress direction of the moving unit.

16. The apparatus of claim 11, wherein the sensing bar has a same width as the moving unit.

17. The apparatus of claim 11, wherein an alarm sounds when an obstacle is sensed.

18. The apparatus of claim 11, wherein the moving unit ceases movement when an obstacle is sensed.

* * * * *